(12) United States Patent
Yang et al.

(10) Patent No.: US 7,251,136 B2
(45) Date of Patent: Jul. 31, 2007

(54) HEAT DISSIPATION DEVICE HAVING A VENTILATING DUCT

(75) Inventors: Bo-Yong Yang, Guangdong (CN); Shih-Hsun Wung, Guangdong (CN); Chun-Chi Chen, Guangdong (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/306,449

(22) Filed: Dec. 29, 2005

(65) Prior Publication Data

US 2007/0153476 A1 Jul. 5, 2007

(51) Int. Cl.
*H05K 7/20* (2006.01)

(52) U.S. Cl. ............ 361/695; 361/690; 174/15.1; 174/16.1; 165/80.3; 165/185; 257/722

(58) Field of Classification Search ........ 361/695, 361/690, 687, 697; 174/15.1, 16.1, 16.3; 165/80.3, 185; 312/223.2; 454/184; 257/722
See application file for complete search history.

(56) References Cited

U.S. PATENT DOCUMENTS

| 6,031,720 | A | 2/2000 | Crane, Jr. et al. ......... 361/695 |
| 6,215,659 | B1 | 4/2001 | Chen ......................... 361/695 |
| 6,542,364 | B2 * | 4/2003 | Lai et al. .................... 361/697 |

* cited by examiner

*Primary Examiner*—Javaid H. Nasri
(74) *Attorney, Agent, or Firm*—Winston Hsu (57) ABSTRACT

A heat dissipation device includes a heat sink (20) having a plurality of fins (26), a fan duct (50), a fan (70) and a mounting bracket (60) for mounting the fan duct and the fan to the heat sink. The fan duct is mounted to a front side of the heat sink, and includes an inlet, an enlarged outlet covering the front side of the heat sink and at least two channels (56). The fan duct is capable of expanding an airflow generated by the fan by the enlarged outlet and dividing the airflow by the at least two channels into at least two sub-airflows. Thus, the fan can blow the airflow through all of the fins to thereby promote a heat dissipating efficiency of the heat dissipation device.

18 Claims, 7 Drawing Sheets

HEAT DISSIPATION DEVICE HAVING A VENTILATING DUCT

FIELD OF THE INVENTION

The present invention relates to a heat dissipation device, and particularly to a heat dissipation device having a ventilating duct to guide an airflow generated by a fan to a heat sink.

DESCRIPTION OF RELATED ART

Electronic devices such as central processing units (CPUs) generate large amounts of heat during normal operation, which can destabilize the electronic devices and cause damage to the electronic devices. Oftentimes, a heat dissipation device is used to dissipate heat from an electronic device. The heat dissipation device frequently comprises a heat sink for being attached to the electronic device.

Such a heat sink typically includes a base from which fins project. The base of the heat sink conducts heat away from the electronic device and the fins of the heat sink radiate the heat to ambient air. To further promote the heat removal effectiveness, a fan is typically disposed adjacent to a front side the heat sink to blow or otherwise force airflow through the fins of the heat sink.

One problem with this approach, however, is that the airflow which the fan can generate to flow through the fins of the heat sink is limited only a portion of the fins, since the heat sink is much larger in volume than that of the fan. In other words, the fan is unproportionately smaller than the heat sink, and can not cover the front side of the heat sink totally. Therefore, the airflow generated by the fan can not flow through all of the fins of the heat sink thoroughly, which, in turn, adversely affects the heat-dissipation effectiveness of the heat sink.

SUMMARY OF INVENTION

Accordingly, what is needed is a heat dissipation device having a ventilating duct; the duct has an enlarged outlet and a plurality of channels which can effectively disperse and divide an airflow generated by a fan over a total area of a front side of a heat sink; thus, the airflow can flow thoroughly through every fin of the heat sink to effectively remove heat therefrom so as to enhance heat dissipating efficiency of the heat sink.

According to a preferred embodiment of the present invention, a heat dissipation device comprises a heat sink assembly having a plurality of fins, a fan duct, a fan and a mounting bracket for mounting the fan duct and the fan to the heat sink assembly. The fan duct mounted to a front side of the heat sink assembly, and comprises an inlet, an enlarged outlet and at least two channels. The fan duct is capable of expanding an airflow generated by the fan to flow over the entire front side of the heat sink. The enlarged outlet covers a total area of the front side of the heat sink, and the at least two channels divide the airflow into two sub-airflows. Thus, the airflow generated by the fan can blow all of the fins through the fan duct, whereby the heat dissipation device can have a better heat dissipating efficiency.

Other advantages and novel features of the present invention will become more apparent from the following detailed description of preferred embodiment when taken in conjunction with the accompanying drawings, in which:

DETAILED DESCRIPTION

Figure 1:
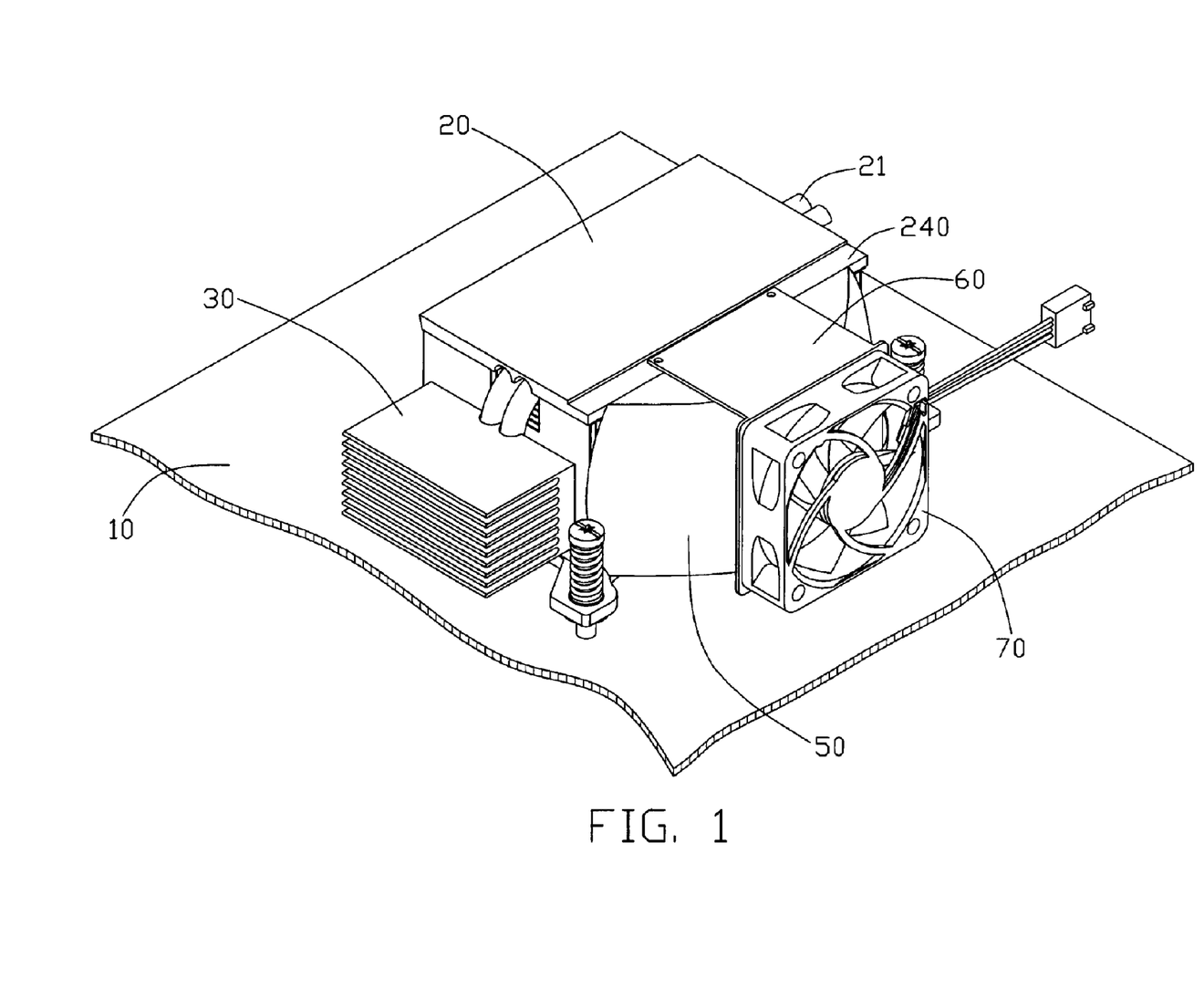
FIG. 1 is an assembled, isometric view of a heat dissipation device according to a preferred embodiment of the present invention.

FIG. 1 shows a heat dissipation device mounted on a printed circuit board (PCB) 10. The heat dissipation device comprises a heat sink assembly having a first heat sink 20 and a second heat sink 30 mounted to the first heat sink 20 via a pair of heat pipes 21, a fan duct 50 mounted to a front side of the first heat sink 20, a fan 70 blowing an airflow to the first heat sink 20 via the fan duct 50, and a mounting bracket 60 for mounting the fan 70 and the fan duct 50 to the first heat sink 20.

Figure 2:
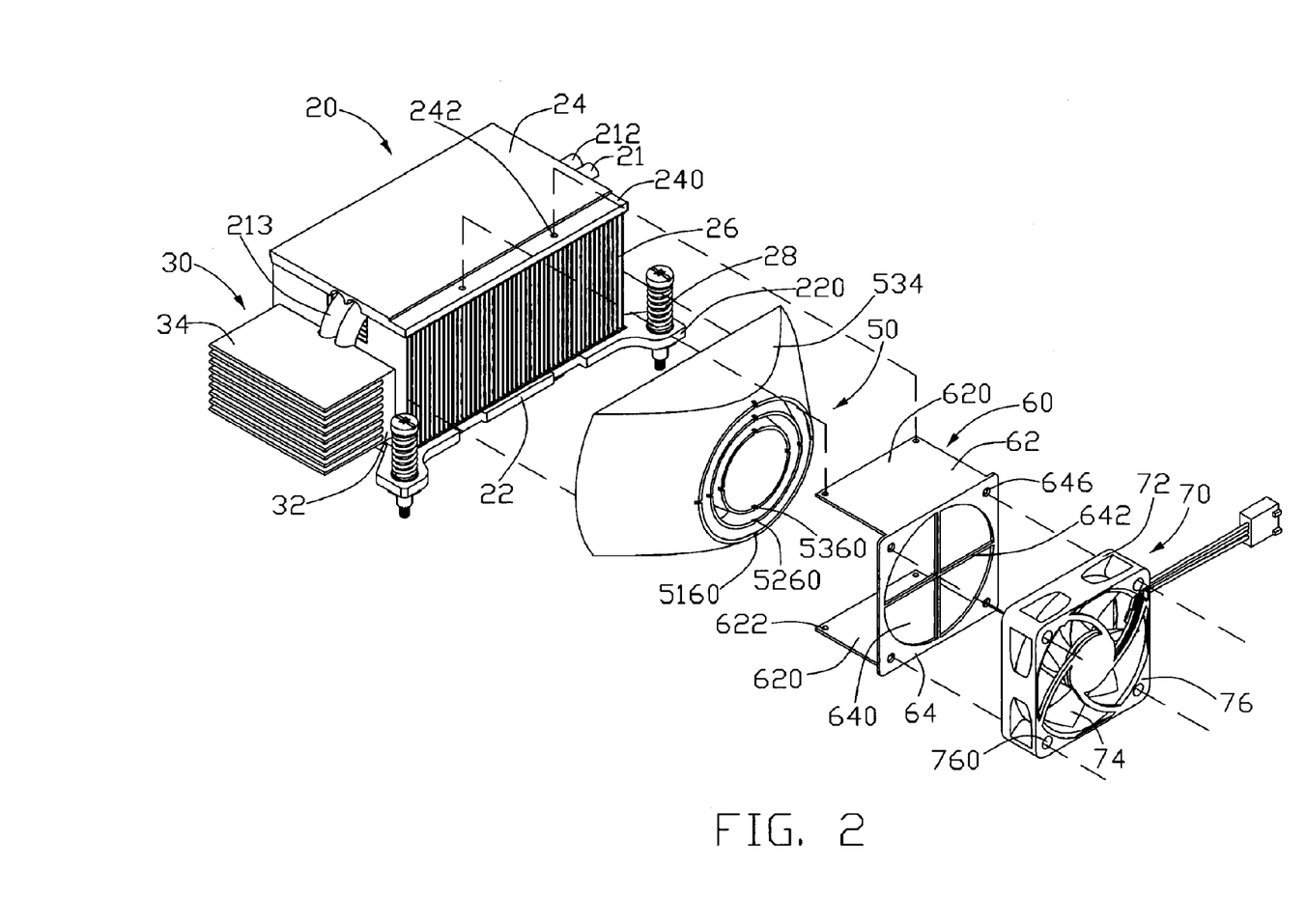
FIG. 2 is a partly exploded view of FIG. 1.
Figure 3:
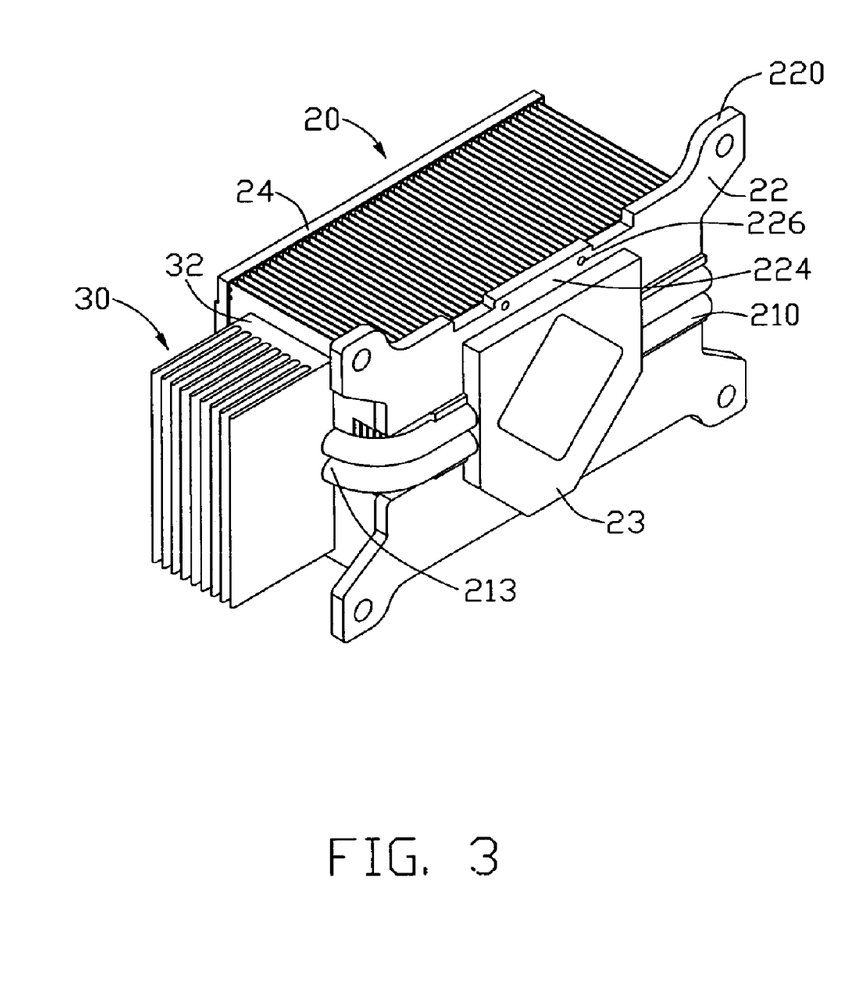
FIG. 3 is an assembled view of a heat sink assembly of FIG. 2 from another aspect.

Referring to FIGS. 2-3, the first heat sink 20 has a width longer than a height thereof. The first heat sink 20 comprises a base 22, a top plate 24 and a plurality of fins 26 sandwiched between the base 22 and the top plate 24. A heat spreader 23 is attached to a bottom surface of the base 22 and contacts a CPU (not shown) mounted on the PCB 10. The heat spreader 23 is made of metal material such as copper, with good heat conductivity. A total size of the heat spreader 23 is smaller than that of the base 22 such that a step 224 is formed on the base 22 relative to the heat spreader 23. The step 224 defines screw holes 226. The base 22 forms an ear 220 extending outwardly from each of four corners thereof. The first heat sink 20 is fastened to the PCB 10 by fasteners 28 extending through the ears 220 to engage with a back plate (not shown) on an underside of the PCB 10. The top plate 24 defines a step 240 at a front edge thereof, opposite to the step 224 of the base 22. The step 240 defines a pair of screw holes 242 in alignment with the screw holes 226.

The heat pipes 21 are mounted to the first heat sink 20. Each heat pipe 21 has a U-shaped configuration, and forms a capillary structure therein. Working medium is contained in the heat pipe 21. Each heat pipe 21 comprises an evaporating portion 210, a condensing portion 212 parallel to the evaporating portion 210, and a middle portion 213 interconnecting the evaporating portion 210 and the condensing portion 212. The evaporating portions 210 of the heat pipes 21 are sandwiched between the heat spreader 23 and the base 22, for absorbing heat generated by the CPU. The condensing portions 212 of the heat pipes 21 are sandwiched between a top of the fins 26 and the top plate 24, for dissipating the heat from the heat spreader 23 to the fins 26. The CPU engages a bottom face of the heat spreader 23 directly below the evaporating portions 210 of the heat pipes 21. When the evaporating portions 210 absorb the heat from the CPU, the working fluid in the evaporating portions 210 becomes vapor. The vapor flows to the condensing portions 212 of the heat pipes 21 and is cooled and condensed into liquid. The condensed working fluid flows back to the evaporating portions 210 by capillarity effect of the capillary structure in the heat pipes 21 to complete a heat discharging cycle in the heat pipes 21. Thereafter, the circle is repeated.

The second heat sink 30 is mounted to the first heat sink 20, for enhancing heat dissipation efficiency. The second heat sink 30 comprises a base 32 thermally connected to the middle portions 213 of the heat pipes 21. The base 32 is parallel to a lateral side of the fins 26. A plurality of fins 34 extends laterally from a side of the base 32. The fins 34 of the second heat sink 30 are oriented perpendicular to the fins 26 of the first heat sink 20.

Figure 4:
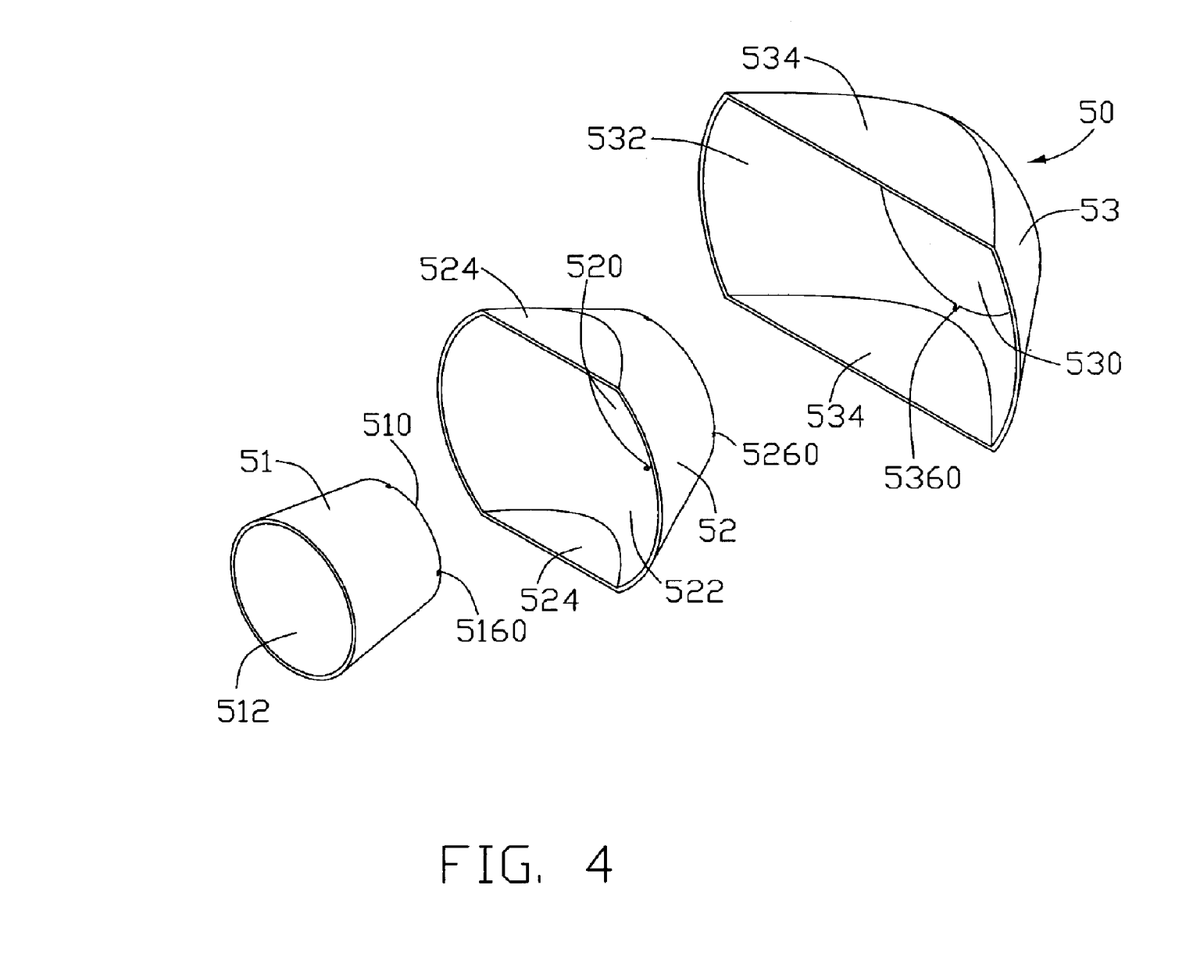
FIG. 4 is an exploded, isometric view of a fan duct FIG. 2.
Figure 5:
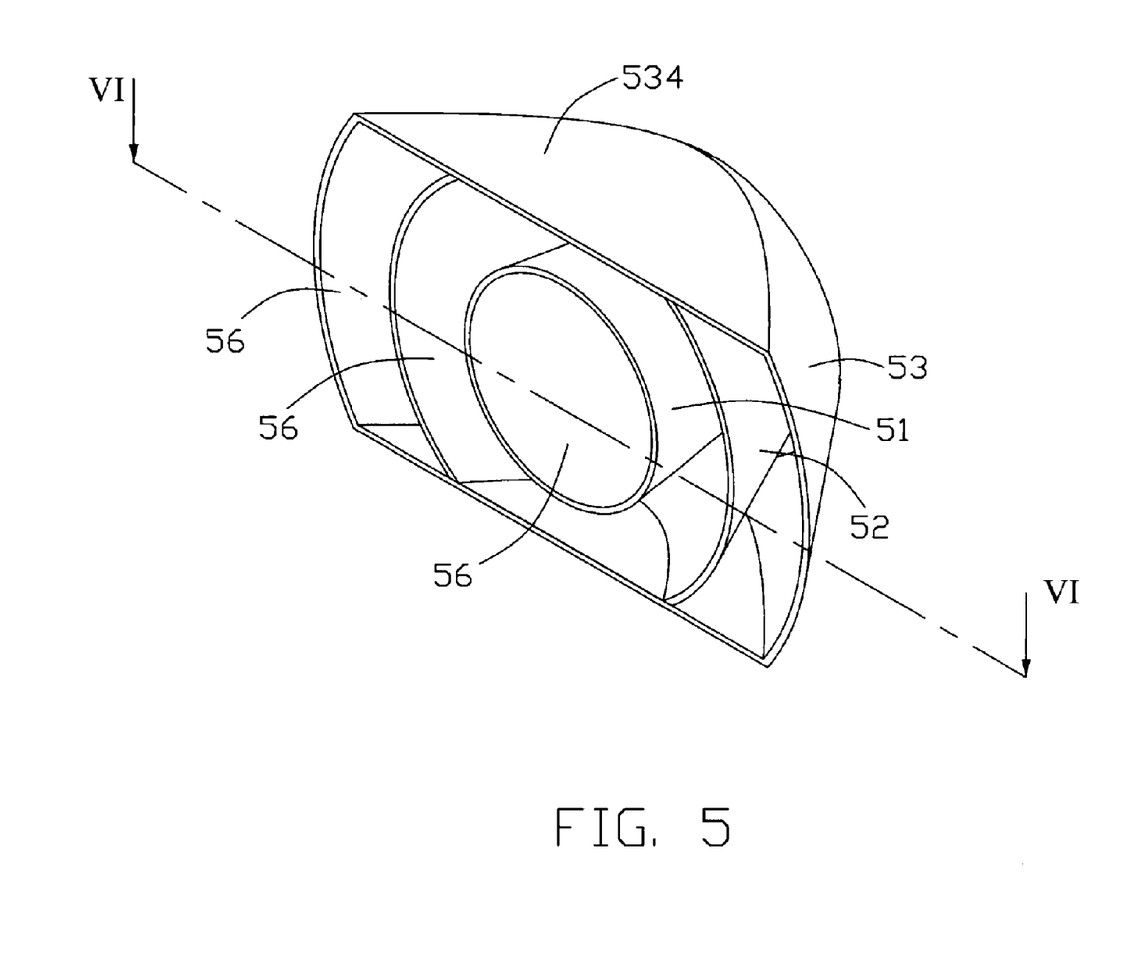
FIG. 5 is an assembled view of FIG. 4.
Figure 6:
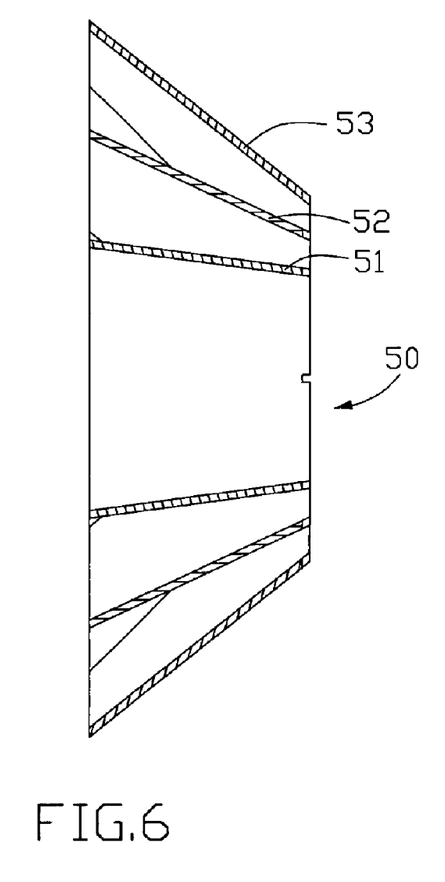
FIG. 6 is a cross-sectional view taken along line VI-VI of FIG. 5.

Also referring to FIGS. 4-6, the fan duct 50 is mounted to a the front side of the first heat sink 20. The fan duct 50 is made of plastic by injection molding or made of cardboard by folding. The fan duct 50 comprises a first tube 51, a second tube 52 and a third tube 53. The first, second and third tubes 51, 52, 53 have a same length along an axial direction thereof. The first, second and third tubes 51, 52, 53 each have a funnel-shaped configuration. The first, second and third tubes 51, 52, 53 each have an inlet 510, 520, 530 and an enlarged outlet 512, 522, 532. A diameter of each outlet 512, 522, 532 is bigger than that of the corresponding inlet 510, 520, 530. The first tube 51 has a gradually increased radius from the inlet 510 to the outlet 512 thereof. The second and third tubes 52, 53 are truncated at opposite top and bottom surfaces adjacent to the outlets 520, 530 thereof, respectively, such that the second and third tubes 52, 53 have a pair of opposite flat surfaces 524, 534, respectively. The second and first tubes 52, 51 are in turn mounted into the third tube 53 and the flat surface 524 of the second tube 52 contacts the flat surface 534 of the third tube 53 such that three divided channels 56 are formed by the first, second and third tubes 51, 52, 53 in the fan duct 50. Radiuses of the first, second and third tubes 51, 52, 53 are in turn increased along a horizontal direction of the fan duct 50. An outlet (not labeled) of the fan duct 50 has a width larger than a height thereof, thereby to fit the shape of the front side of the first heat sink 20. Edges of the inlets 510, 520, 530 of the first, second and third tubes 51, 52, 53 each define four cutouts 5160, 5260, 5360. The cutouts 5160, 5260, 5360 are located on two perpendicularly crossed horizontal and vertical lines through an inlet (not labeled) of the fan duct 50. When mounted to the first heat sink 20, the outlet of the fan duct 50 covers substantially a total area of the front side of the first heat sink 20.

Figure 7:
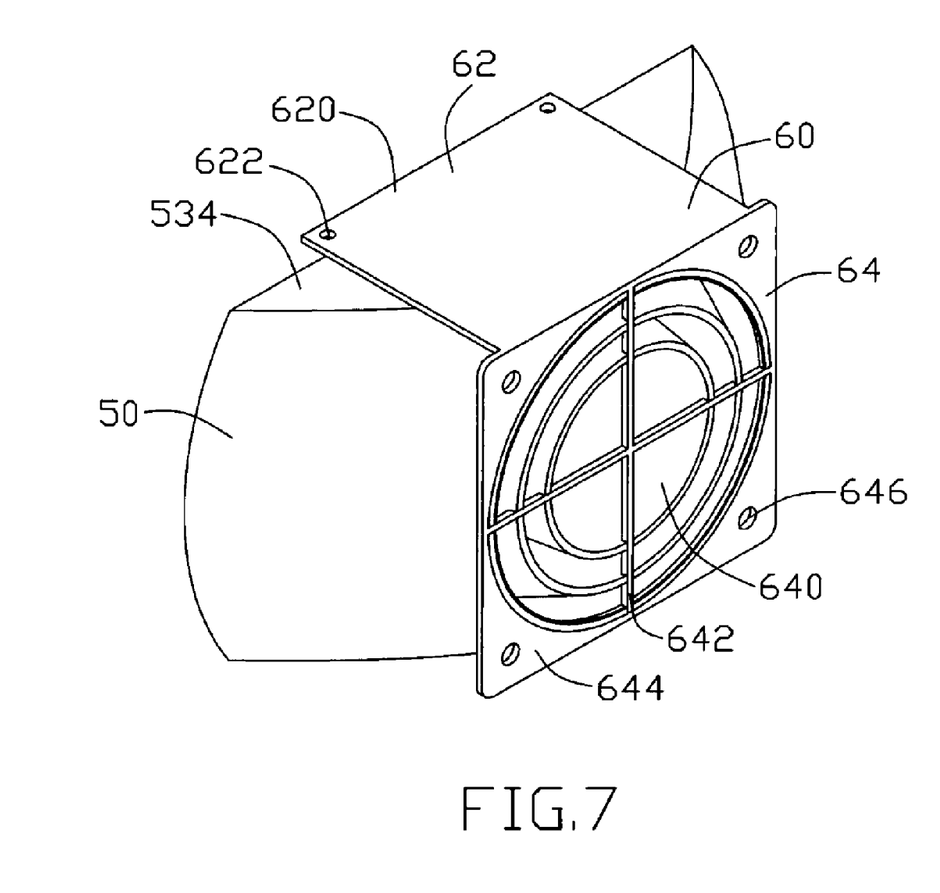
FIG. 7 is an assembled view of the fan duct and a mounting bracket of FIG. 2.

Also referring to FIG. 7, the mounting bracket 60 has a U-shaped configuration. The mounting bracket 60 comprises a pair of parallel side walls 62 parallel to the flat surfaces 534 of the third tube 53 of the fan duct 50, for facilitating the fan duct 50 to be sandwiched between the side walls 62. The mounting bracket 60 further comprises a faceplate 64 interconnecting front edges of the side walls 62. A rear edge 620 of each of the side walls 62 defines a pair of through holes 622 corresponding to the screw holes 242, 226 of the first heat sink 20. The rear edges 620 of the mounting bracket 60 are respectively positioned on the steps 240, 224 of the first heat sink 20 such that the step 240 of the top plate 24 and the step 224 of the base 22 are sandwiched between the rear edges 620 of the mounting bracket 60. The mounting bracket 60 is fixed to the first heat sink 20 by extending screws (not shown) through the through holes 622 to threadedly engage with the screw holes 242, 226 of the first heat sink 20. The faceplate 64 has a square configuration, and defines a circular opening 640 at a center thereof. A pair of crossed ribs 642 corresponding to the cutouts 5160, 5260, 5360 of the fan duct 50 is formed on the faceplate 64. The two ribs 642 are perpendicular each other and divide the opening 640 into four equal quadrants. The ribs 642 engage in the cutouts 5160, 5260, 5360 of the fan duct 50 such that the inlet of the fan duct 50 corresponds to the opening 640. The faceplate 64 has four corners 644. Each corner 644 defines a screw hole 646.

Referring again to FIG. 2, the fan 70 has a square configuration, and comprises a fan frame 72 and a impeller 74 mounted in the frame 72. The fan frame 72 has four corners 76. Each corner 76 defines a through hole 760 corresponding to the screw hole 646 of the mounting bracket 60. The fan 70 is mounted to the faceplate 64 of the mounting bracket 60 by extending screws (not shown) through the through holes 760 to threadedly engage with the screw holes 646 of the mounting bracket 60. An airflow generated by the fan 70 flows through the channels 56 of the fan duct 50 from the opening 640 of the mounting bracket 60. The airflow can be divided into different sub-airflows by these channels 56 to flow to the fins 26 of the first heat sink 20. The enlarged outlets 512, 522, 532 result in an expansion of the airflow such that the airflow can flow through all of the fins 26. The airflow can dissipate heat absorbed by all of the fins 26, thereby causing the heat to be quickly dissipated from the CPU and the first heat sink 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device, comprising:
   a heat sink assembly having a plurality of fins;
   a fan duct comprising an inlet, an enlarged outlet and at least two channels extending between the inlet and the outlet, the outlet covering substantially a total area of a side of the fins; and
   a fan being mounted to the inlet of the fan duct and blowing an airflow through the at least two channels of the fan duct to the fins; wherein the fan duct guides the airflow through the at least two channels to the fins, and is capable of expanding the airflow by the enlarged outlet and dividing the airflow by the at least two channels into at least two sub-airflows.

2. The heat dissipation device as described in claim 1, wherein each of the at least two channels is annular, and a radius of each of the at least two channels is gradually increased from the inlet to the outlet.

3. The heat dissipation device as described in claim 1, wherein the fan duct has a funnel-shaped configuration.

4. The heat dissipation device as described in claim 1, wherein a diameter of the outlet is larger than that of the inlet.

5. The heat dissipation device as described in claim 1, wherein the fan duct comprises at least two tubes.

6. The heat dissipation device as described in claim 1, wherein the fan duct comprises a first tube and a second tube.

7. The heat dissipation device as described in claim 6, wherein the first tube is mounted in the second tube.

8. The heat dissipation device as described in claim 6, wherein a radius of the first tube is smaller than that of the second tube.

9. The heat dissipation device as described in claim 1, further comprising a mounting bracket for mounting the fan duct and the fan to the heat sink.

10. The heat dissipation device as described in claim 9, wherein the mounting bracket is mounted between the fan duct and the fan.

11. The heat dissipation device as described in claim 9, wherein the mounting bracket comprises a pair of parallel side walls and a faceplate interconnecting the side walls, the side walls being connected to the heat sink assembly and the fan being mounted to the faceplate.

12. The heat dissipation device as described in claim 11, wherein the fan duct is sandwiched between the two side walls.

13. The heat dissipation device as described in claim 12, the faceplate defines an opening in alignment with the fan, for providing an access of the airflow generated by the fan to the fan duct.

14. The heat dissipation device as described in claim 13, wherein the faceplate forms two crossed ribs dividing the opening into four regions.

15. The heat dissipation device as described in claim 14, wherein an edge of the inlet of the fan duct defines cutouts corresponding the ribs, the cutouts engagingly receiving the ribs.

16. The heat dissipation device as described in claim 11, wherein the fan duct is truncated at opposite top and bottom surfaces adjacent to the outlet thereof such that the fan duct has a pair of opposite flat surfaces contacting with the two side walls, respectively.

17. A heat dissipation device comprising:

a heat sink having a base adapted for contacting a heat-generating electronic component, a plurality of fins extending upward from the base;

a fan duct having an inlet and an outlet larger than the inlet, the outlet being adjacent to a side of the fins and covering substantially an entire area of the side of the fins; and a fan mounted to the inlet of the fan duct;

wherein the fan duct comprises a plurality of concentric tubes.

18. The heat dissipation device of claim 17 further comprising a mounting bracket for mounting the fan duct and the fan to the heat sink, the mounting bracket having side walls sandwiching the fan duct therebetween and fastened to the heat sink and a faceplate adjacent to the inlet of the fan duct, the fan being mounted to the faceplate.

* * * * *